United States Patent
Zhou et al.

(10) Patent No.: US 11,843,287 B2
(45) Date of Patent: Dec. 12, 2023

(54) MOTOR THERMAL PROTECTION DEVICE AND OPERATION METHOD THEREOF

(71) Applicant: Schneider Electric Industries SAS, Rueil-Malmaison (FR)

(72) Inventors: Zhangji Zhou, Shanghai (CN); Lei Shi, Shanghai (CN); Ying Shi, Shanghai (CN); Bing Shuang, Shanghai (CN); Haijun Zhao, Shanghai (CN); Wenhua Wang, Shanghai (CN); Shuang Sun, Shanghai (CN); Siyu Liu, Shanghai (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 229 days.

(21) Appl. No.: 17/377,824

(22) Filed: Jul. 16, 2021

(65) Prior Publication Data

US 2022/0021279 A1    Jan. 20, 2022

(30) Foreign Application Priority Data

Jul. 16, 2020    (CN) .......................... 202010685927.9

(51) Int. Cl.
*H02K 11/25*    (2016.01)
*G01R 31/34*    (2020.01)
*H02H 7/085*    (2006.01)

(52) U.S. Cl.
CPC .......... *H02K 11/25* (2016.01); *G01R 31/343* (2013.01); *H02H 7/0852* (2013.01)

(58) Field of Classification Search
CPC ........ H02K 11/25; G01R 31/343; G01K 3/04; G01K 7/42; H02H 3/006; H02H 7/085; H02H 7/0833; H02H 7/0852; H02H 6/005

See application file for complete search history.

(56) References Cited

U.S. PATENT DOCUMENTS

| | | | |
|---|---|---|---|
| 2005/0237692 A1 | 10/2005 | Grehant | |
| 2012/0123762 A1* | 5/2012 | Studer, II | H02H 1/06 361/93.6 |
| 2016/0056622 A1 | 2/2016 | Hamilton et al. | |

FOREIGN PATENT DOCUMENTS

| | | |
|---|---|---|
| CN | 100446375 C | 12/2008 |
| JP | 3991704 B2 | 10/2007 |
| JP | 2011109814 A | 6/2011 |

OTHER PUBLICATIONS

Extended European Search Report dated Dec. 23, 2021 for corresponding European Patent Application No. 21305983.5-1202, 8 pages.

(Continued)

*Primary Examiner* — Bryan R Perez
(74) *Attorney, Agent, or Firm* — Locke Lord LLP

(57) ABSTRACT

It is disclosed a motor thermal protection device and operation method thereof. The motor thermal protection device utilizes a power supply of a motor for power supplying and comprises: a capacitor timing circuit, configured to time after the motor is powered off; a power-off time determining unit, configured to perform a reading operation of reading an output voltage of the capacitor timing circuit after the motor is powered on, and determine a power-off time from when the motor is powered off to when the motor is powered on according to the output voltage; and a heat accumulation calculating unit, configured to calculate a remaining heat accumulation when the motor is powered on according to the power-off time and a heat accumulation when the motor is powered off.

14 Claims, 7 Drawing Sheets

(56) References Cited

OTHER PUBLICATIONS

Korean Office Action dated Jan. 27, 2023 for corresponding Korean Patent Application No. Oct. 2021-0092217, 4 pages.

* cited by examiner

MOTOR THERMAL PROTECTION DEVICE AND OPERATION METHOD THEREOF

TECHNICAL FIELD

The present disclosure relates to a motor thermal protection device and an operation method of the motor thermal protection device.

BACKGROUND

Industrial processes often require continuous operation of electromechanical equipment, and an accident caused by motor overheating or failure of temperature control occurs from time to time. The use of motor thermal protection devices enables the motor to be automatically powered off when it is overheated so as to protect the motor and the electromechanical equipment in the circuit. The current motor thermal protection device cannot accurately track and monitor the accumulative heat accumulation of the motor and judge the thermal state of the motor in real time because it cannot know the remaining heat accumulation when the motor is powered on. If the accumulative heat accumulation of the motor is judged based on the experience of the operator, it may cause unnecessary accidents due to low accuracy; and it may also not be allowed to use the motor after waiting for enough time (generally, at least 50 minutes) to completely cool the heat accumulation of the motor.

SUMMARY OF THE INVENTION

The present disclosure relates to a motor thermal protection device capable of determining the remaining heat accumulation when the motor is powered on, and an operation method thereof.

According to one aspect of the present disclosure, there is provided a motor thermal protection device which utilizes a power supply of a motor for power supplying, the motor thermal protection device comprises: a capacitor timing circuit, configured to time after the motor is powered off; a power-off time determining unit, configured to perform a reading operation of reading an output voltage of the capacitor timing circuit after the motor is powered on, and determine a power-off time from when the motor is powered off to when the motor is powered on according to the output voltage; and a heat accumulation calculating unit, configured to calculate a remaining heat accumulation when the motor is powered on according to the power-off time and a heat accumulation when the motor is powered off.

According to another aspect of the present disclosure, there is provided an operation method of a motor thermal protection device. The motor thermal protection device utilizes a power supply of a motor for power supplying. The motor thermal protection device comprises a capacitor timing unit, a power-off time determining unit and a heat accumulation calculating unit, and the method comprises: timing, by the capacitor timing unit, after the motor is powered off; performing, by the power-off time determining unit, a reading operation of reading an output voltage of the capacitor timing circuit after the motor is powered on, and determining, by the power-off time determining unit, a power-off time from when the motor is powered off to when the motor is powered on according to the output voltage; and calculating, by the heat accumulation calculating unit, a remaining heat accumulation when the motor is powered on according to the power-off time and a heat accumulation when the motor is powered off.

According to an embodiment of the present disclosure, when the motor is powered on, the motor thermal protection device can obtain the cooling time from when the motor is powered off to when the motor is powered on, thereby obtaining the remaining heat accumulation when the motor is powered on, and calculating optionally the accumulative heat accumulation of the motor in real time during a period when the motor is powered on (hereinafter, referred to as power on period of the motor), so as to protect the motor and other electromechanical equipment in the circuit from being damaged due to overheating of the motor.

BRIEF DESCRIPTION OF THE DRAWINGS

Aspects, features and advantages of the present disclosure will become clearer and easier to understand through the following description of the embodiments in conjunction with the accompanying drawings, in which.

DESCRIPTION OF THE EMBODIMENTS

Figure 1:
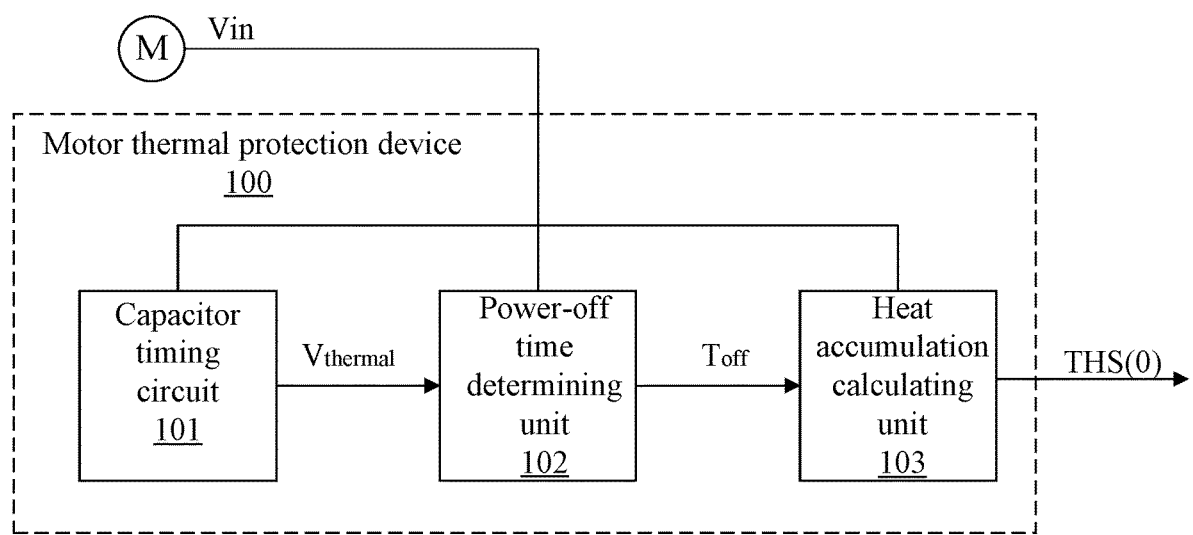
FIG. 1 is a schematic circuit diagram of a motor thermal protection device according to an embodiment of the present disclosure.

The present disclosure will be described in detail below with reference to exemplary embodiments of the present disclosure. However, the present disclosure is not limited to the embodiments described herein, and it may be implemented in many different forms. The described embodiments are only used to make this disclosure thorough and complete, and to fully convey the concept of the disclosure to those skilled in the art. The features of the various embodiments described may be combined or replaced with each other, unless explicitly excluded or should be excluded according to the context.

For motor thermal protection, thermal overload relays that are easy to install and low in cost are often used in the industry. However, traditional thermal overload relays cannot know power-off time from the last power-off to a power-on of a motor when the motor is powered on, and therefore cannot obtain a remaining heat accumulation when the motor is powered on, thereby cannot accurately calculate the accumulative heat accumulation of the motor over time in real time. Such thermal overload relays are not sufficient to ensure the safe use of electromechanical equipment in motors and circuits.

The present disclosure proposes a motor thermal protection device, which is configured to obtain a remaining heat accumulation when a motor is powered on and can calculate the accumulative heat accumulation of the motor over time in real time. The motor thermal protection device includes a capacitor timing circuit, which utilizes a principle of capacitor charging and discharging to obtain a discharge time of a capacitor, thereby obtaining a power-off time from power-off to power-on of the motor. The motor thermal protection device can calculate a heat dissipation of the motor from power-off to power-on based on the power-off time according to the heat dissipation principle, so as to obtain the remaining heat accumulation when the motor is powered on, and then can calculate the accumulative heat accumulation of the motor over time in real time, the motor can in turn be protected based on the real-time heat accumulation, for example, the motor is powered off when it is judged that the motor is overheated. According to embodiments of the present disclosure, the capacitor timing circuit can perform timing when the motor is powered off, which leads to the power-off of the motor thermal protection device, solving the problem that it cannot be timed after the motor is powered off in the prior art.

According to embodiments of the present disclosure, the motor thermal protection device can also perform a diagnosis operation and a calibration operation. The diagnosis operation is usually performed by the user as needed during the daily use of the motor thermal protection device and it can diagnose whether there is a fault in the motor thermal protection device, so as to prevent the motor from failing to be powered off in time when the motor is overheated. The calibration operation is usually performed by the manufacturer when the motor thermal protection device leaves the factory, and it is used to calibrate the capacitance values of capacitors included in the motor thermal protection device, then the user performs related calculations on the basis of the calibrated capacitance values, so that the obtained remaining heat accumulation and accumulative heat accumulation are more accurate.

FIG. 1 is a schematic circuit module diagram of a motor thermal protection device 100 according to an embodiment of the present disclosure. The motor thermal protection device 100 utilizes a power supply of a motor for power supplying. Therefore, when the motor is powered off, the various components of the motor thermal protection device also lose power supplying. For example, the motor thermal protection device 100 receives an input voltage provided by the power supply of the motor via an input power line, and the input voltage is provided to each circuit unit after necessary conversion.

The motor thermal protection device 100 includes a capacitor timing circuit 101. The capacitor timing circuit 101 is configured to time after the motor is powered off. Specifically, the capacitor timing circuit 101 can perform timing through a capacitor (for example, the capacitor C in FIG. 2) and a discharge resistor (for example, the first resistor R1 in FIG. 2) included in the capacitor timing circuit 101 according to the principle of capacitor charging and discharging. For example, during a power-on period of the motor, the capacitor C in the capacitor timing circuit 100 can be charged to a maximum capacitor voltage, and during a period when the motor is powered off (hereinafter, referred to as power off period of the motor), the capacitor C can be discharged. If the motor is powered on again after a certain period of time (that is, a discharge time), an output voltage $V_{thermal}$ output from the capacitor timing circuit 101 representing the voltage remaining across the capacitor after the discharge time can be used to calculate a power-off time $T_{off}$ from when the motor is powered off to when the motor is powered on again.

The motor thermal protection device 100 further includes a power-off time determining unit 102. The power-off time determining unit 102 is configured to perform a reading operation of reading the output voltage $V_{thermal}$ of the capacitor timing circuit 101 after the motor is powered on, and determine the power-off time $T_{off}$ from when the motor is powered off to when the motor is powered on according to the output voltage $V_{thermal}$.

The motor thermal protection device 100 further includes a heat accumulation calculating unit 103. The heat accumulation calculating unit 103 calculates a remaining heat accumulation THS(0) when the motor is powered on according to the power-off time $T_{off}$ determined by the power-off time determining unit 102 and a heat accumulation $THS_{last}$ when the motor is powered off. The heat accumulation $THS_{last}$ when the motor is powered off may be a value stored in a memory (not shown) of the motor thermal protection device 100, which represents the closest value to the accumulative heat accumulation at the time the motor is powered off which is calculated and stored by the motor thermal protection device 100 during the last power-on period of the motor. The memory may be a memory that is provided inside the motor thermal protection device 100 or provided outside the motor thermal protection device 100 and can be read data from and written data to the motor thermal protection device 100.

According to the above-mentioned embodiment of the present disclosure, by calculating the power-off time of the motor from when the motor is powered off to when the motor is powered on according to the output voltage $V_{thermal}$ of the capacitor timing circuit 101 after the discharge time, the remaining heat accumulation THS(0) during the power-on period of the motor can be obtained, and thus the accumulative heat accumulation accumulated over time during the power-on period of the motor can be calculated in real time. At the same time, whether the accumulative heat accumulation satisfies a condition for the motor to trip can be judged according to a preset motor trip criterion, and when the accumulative heat accumulation satisfies the condition for the motor to trip, corresponding actions are taken to trip the motor so that the motor is powered off, thereby preventing the motor and the electromechanical equipment in the circuit from being damaged due to overheating of the motor.

Figure 2:
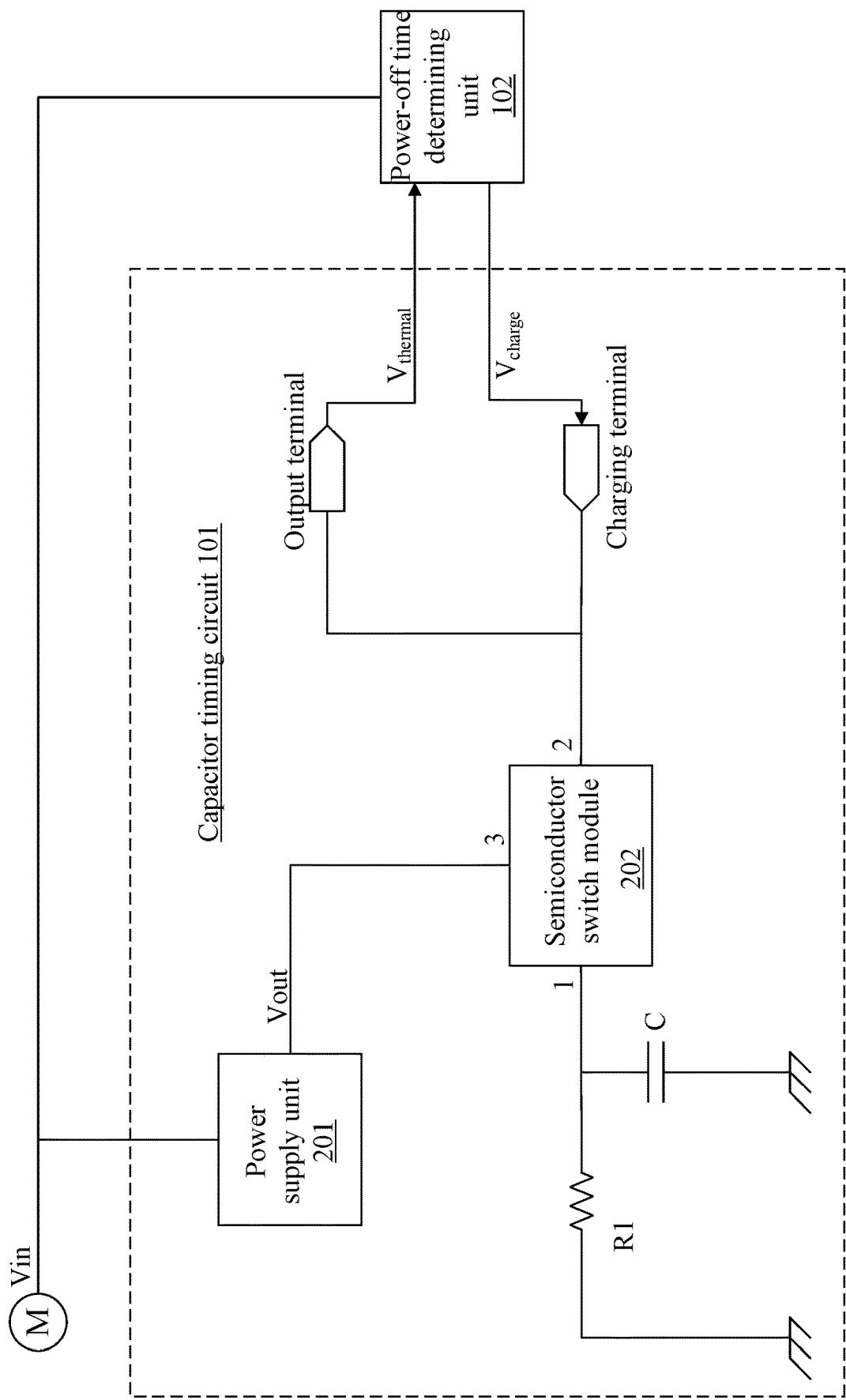
FIG. 2 is a schematic circuit diagram of a capacitor timing circuit in a motor thermal protection device according to an embodiment of the present disclosure.

Each unit of the motor thermal protection device 100 of the present disclosure can be implemented by various specific circuits. For example, the power-off time determining unit 102 and the heat accumulation calculating unit 103 can be implemented by the same micro-control unit (MCU), and the MCU can also implement other calculation or control functions of the present disclosure, such as judging whether the accumulative heat accumulation satisfies a condition for the motor to trip and controlling the motor to trip, etc. FIG. 2 is a schematic circuit diagram of the capacitor timing circuit 101 in the motor thermal protection device 100 according to an embodiment of the present disclosure. It should be noted that the specific structure of the capacitor timing circuit 101 in FIG. 2 can be replaced by other suitable structures.

Referring to FIG. 2, the capacitor timing circuit 101 includes a power supply unit 201, a capacitor C, a first resistor R1, a semiconductor switch module 202, a charging terminal, and an output terminal.

When the motor is powered on, the power supply unit 201 receives an input voltage yin provided by the power supply of the motor, and outputs a voltage $V_{out}$ (for example, 10V) applied to a control terminal 3 of the semiconductor switch module 202. The semiconductor switch module 202 includes a first terminal 1, a second terminal 2 and the control terminal 3. In the configuration of this embodiment, $V_{out}$ controls the conduction between the first terminal 1 and the second terminal 2 of the semiconductor switch module 202, and at this time, the capacitor C can be charged through the capacitor charging voltage $V_{charge}$ (for example, 3V) provided by the power-off time determining unit 102. In this embodiment, the power-off time determining unit 102 may provide the capacitor charging voltage $V_{charge}$ to the capacitor timing circuit 101 through a digital-to-analog converter (DAC), and the capacitor C may be charged to a maximum capacitor voltage E within a few milliseconds.

When the motor is powered off, the power supply of the motor stops providing the input voltage $V_{in}$, the power supply unit 201 stops outputting the voltage $V_{out}$ to be applied to the control terminal 3 of the semiconductor switch module 202, and the semiconductor switch module 202 is not conducted between the first terminal 1 and the second terminal 2. At this time, the capacitor C and the first resistor R1 form a discharge circuit, and the capacitor C is discharged through the first resistor R1. The capacitor C can be charged to and maintain the maximum capacitor voltage E when the motor is powered on, so the initial voltage across the capacitor C at the beginning of discharge can be the maximum capacitor voltage E. According to the principle of capacitor charging and discharging, after a discharge time t since the motor is powered off, the remaining voltage across the capacitor C (that is, the output voltage of the capacitor timing circuit 101) $V_{thermal}$ and the voltage across the capacitor C when the motor is powered off and the discharge time t satisfy the following equation (1):

$$V_{thermal} = E \times \left(1 - e^{-\frac{t}{Tau1}}\right) \quad (1)$$

where E is the voltage across capacitor C when the motor is powered off, for example, the maximum capacitor voltage; t is the discharge time; $V_{thermal}$ is the remaining voltage across capacitor C after the discharge time t has elapsed; Tau1 is a time constant, which is equal to the product of a capacitance value of capacitor C and the resistance value of the first resistor R1.

When the motor is powered on again after the power-off time $T_{off}$ has elapsed from the power-off, the power supply unit 201 may output the voltage $V_{out}$ to be applied to the control terminal 3 of the semiconductor switch module 202. At this time, $V_{out}$ controls the conduction between the first terminal 1 and the second terminal 2 of the semiconductor switch module 202, and the power-off time determining unit 102 can perform a reading operation to read the output voltage $V_{thermal}$ of the capacitor timing circuit 101 from an output terminal thereof, so as to calculate the remaining heat accumulation of the motor. In addition, during the reading operation, in order to prevent the value of the output voltage $V_{thermal}$ read from the output terminal from being insufficiently accurate due to the discharge of the capacitor C from the charging terminal, the power-off time determining unit 102 may set the charging terminal to a high-resistance input state (for example, by suspending the charging terminal) and then perform the reading operation to ensure that the output voltage $V_{thermal}$ read from the capacitor timing circuit 101 is sufficiently accurate. In addition, after the reading operation is completed, the charging terminal can be reset from the high-resistance input state to a charging voltage input state, that is, the capacitor charging voltage $V_{charge}$ is provided through the digital-to-analog converter (DAC) as described above, so that the capacitor C is charged and thereby the voltage across it remains at the maximum capacitor voltage E. In this way, if the motor is powered off again, the capacitor C will begin to discharge with the maximum capacitor voltage E as the initial voltage.

As mentioned earlier, the discharge time t of the capacitor C can correspond to the power-off time $T_{off}$ from when the motor is powered off to when the motor is powered on. Therefore, the equation (2) used to calculate the power-off time $T_{off}$ can be a variation of equation (1):

$$T_{off} = t = -1 * Tau1 * \text{Ln}\left(\frac{Vthermal}{E}\right) \quad (2)$$

Referring back to FIG. 1, the power-off time determining unit 102 calculates the power-off time $T_{off}$ according to equation (2) from the output voltage $V_{thermal}$ read from the capacitor timing circuit 101.

Thereafter, the heat accumulation calculating unit 103 obtains the power-off time $T_{off}$ from the power-off time determining unit 102, and calculates the remaining heat accumulation THS(0) when the motor is powered on according to the power-off time $T_{off}$, and the way which is used to calculate the remaining heat accumulation THS(0) of the motor can be as equation (3):

$$THS(0) = THS_{last} \cdot e^{-Toff/Tau2} \quad (3)$$

where THS(0) is the remaining heat accumulation when the motor is powered on; $THS_{last}$ is the heat accumulation when the motor is powered off, which can be directly read from the memory (not shown) of the motor thermal protection device 100; and Tau2 is a time constant, which is proportional to a thermal overload level of the motor, determined by the heat dissipation capacity of the motor and can be determined through experiments.

By calculating the remaining heat accumulation THS(0) when the motor is powered on, the accumulative heat accumulation of the motor can be tracked and monitored in real time. Therefore, the heat accumulation calculating unit 103 may calculate the accumulative heat accumulation accumulated over time t during the power-on period of the motor according to equation (4) and based on the remaining heat accumulation THS(0) calculated through equation (3):

$$THS(t) = THS(0) + I^2(t) \times \left(1 - e^{\frac{t}{Tau2}}\right) \quad (4)$$

where t is an elapsed time since the motor is powered on; THS(t) is an accumulative heat accumulation of the motor after the time t has elapsed since the motor is powered on; THS(0) is a remaining heat accumulation when the motor is powered on calculated through equation (3); I is a current of the motor; Tau2 is a time constant, which is proportional to a thermal overload level of the motor.

In some embodiments, the accumulative heat accumulation of the motor can be calculated every one time interval, the time intervals for calculating the accumulative heat accumulation can be set to 100 milliseconds, 150 milliseconds, etc. as needed, and the calculated value is stored in the memory of the thermal protection device 100. A new value of the accumulative heat accumulation calculated every time interval is used as an updated value to overwrite a value of the accumulative heat accumulation calculated in the previous time interval and stored in the memory, so that the latest value of the accumulative heat accumulation is always stored in the memory. Optionally, in some cases, considering that frequently reading data from the memory or writing data to the memory will damage the life of the memory, it is also possible to store the current value of the accumulative heat accumulation in the memory only when detecting that the motor is about to be powered off or be thermal tripped. In addition, the new value of the accumulative heat accumulation calculated at every time interval is used to judge whether it satisfies a condition for the motor to trip according to a preset motor trip criterion. There can be various preset motor trip criteria, in one example, the new value of the accumulative heat accumulation calculated at every time interval can be compared with a predetermined threshold value of the accumulative heat accumulation, and if the new value of the accumulative heat accumulation exceeds the predetermined threshold value of the accumulative heat accumulation, it is determined that the condition for the motor to trip is satisfied; in another example, the new value of the accumulative heat accumulation calculated at every time interval is appropriately converted and then compared with the predetermined threshold value of the accumulative heat accumulation, and if the new value of the accumulative heat accumulation exceeds the predetermined threshold value of the accumulative heat accumulation, it is determined that the condition for the motor to trip is satisfied, for example, the new value of the accumulative heat accumulation is converted into a thermal capacity of the motor, and if the thermal capacity $>=1$, it is determined that the condition for the motor to trip is satisfied. The present disclosure does not set limits thereto, and the preset motor trip criterion can also be any other suitable criterion.

The above-described embodiments of the present disclosure can obtain the power-off time from when the motor is powered off to when the motor is powered on by means of the principle of capacitor charging and discharging, thereby obtain the remaining heat accumulation when the motor is powered on, then use the remaining heat accumulation as the initial value to calculate and track the accumulative heat accumulation of the motor in real time, and when it is judged that the value of the accumulative heat accumulation satisfies the condition for the motor to trip according to the preset motor trip criterion, it is determined that the motor should be powered off. In this case, the power-off operation allowed by the user can be automatically performed to power off the motor (for example, controlled by the MCU), or an alarm message can be sent to the user (for example, turning on an alarm light, sounding an alarm, etc.) to make the user manually perform the power-off operation. In this way, the accumulative heat accumulation of the motor can be tracked and monitored in real time, and the motor and other electromechanical equipment can be prevented from being damaged due to overheating of the motor.

Figure 3:
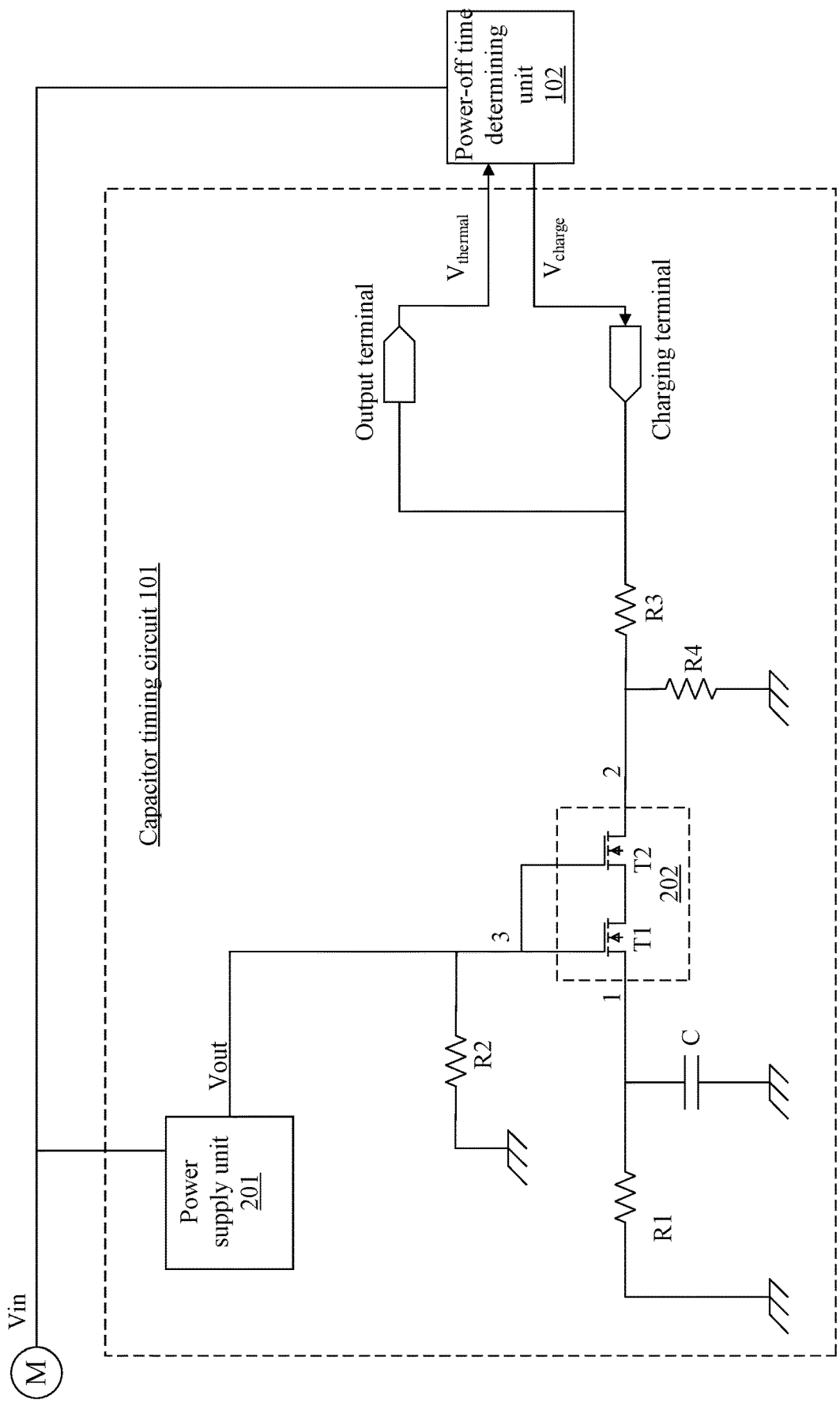
FIG. 3 is a schematic circuit diagram of a capacitor timing circuit in a motor thermal protection device according to an embodiment of the present disclosure.

As an embodiment of the present disclosure, the semiconductor switch module 202 in the capacitor timing circuit 101 may have various structures, and the capacitor timing circuit 101 may also include some auxiliary elements. FIG. 3 shows a schematic circuit diagram of the capacitor timing circuit 101 in the motor thermal protection device 100 according to an embodiment of the present disclosure.

As an example, referring to FIG. 3, the semiconductor switch module 202 may include at least one MOS transistor connected in series, for example, T1 and T2. Each of the at least one MOS transistor includes a control terminal, a first terminal, and a second terminal. When receiving the voltage $V_{out}$ output by the power supply unit, the control terminal of each MOS transistor controls the conduction between its own first terminal and second terminal, and the control terminals of respective MOS transistors are connected together as the control terminal of the semiconductor switch module 202. A first terminal of a first MOS transistor of the at least one MOS transistor connected in series is connected as the first terminal of the semiconductor switch module 202 to the first terminal of the capacitor C, and a second terminal of the last MOS transistor of the at least one MOS transistor connected in series is connected as the second terminal of the semiconductor switch module 202 to the charging terminal and the output terminal. In the configuration of this example, the power supply unit 201 can control whether to output the voltage $V_{out}$ to be applied to the control terminals of T1 and T2, therefore T1 and T2 are turned on or turned off at the same time, thereby controlling the charging and discharging of the capacitor C. The present disclosure is not limited to the specific structure of the semiconductor switch module 202. For example, the present disclosure does not limit the number of MOS transistors, which may include one MOS transistor, or two or more MOS transistors. There is also no limitation on the type of MOS transistors, which can include only NMOS transistors, only PMOS transistors, or both, and the types of MOS transistors can also include ordinary MOS transistors, MOS transistors with parasitic diodes, etc., as long as the related functions described above can be realized.

As an example, referring to FIG. 3, the capacitor timing circuit 101 may also include some auxiliary elements, such as a second resistor R2, a third resistor R3, and a fourth resistor R4. The second resistor R2 protects the semiconductor switch module 202. For example, when the power supply unit does not output the voltage $V_{out}$ to be applied to the control terminal of the semiconductor switch module 202 during the power-off period of the motor, the presence of the second resistor R2 can prevent the control terminal of the semiconductor switch module 202 from floating. When the power-off time determining unit 102 charges the capacitor C through the charging terminal, the presence of the third resistor R3 can protect the capacitor C from being damaged due to excessive charging current. The presence of the fourth resistor R4 can speed up the discharge speed of the capacitor C. For example, the resistance value of the fourth resistor R4 can be set to be small, so that the capacitor C has a more obvious and easy-to-observe discharge amount to be used for capacitance value calibration in a shorter discharge time, as described below in conjunction with FIG. 5 and FIG. 7.

Figure 4:
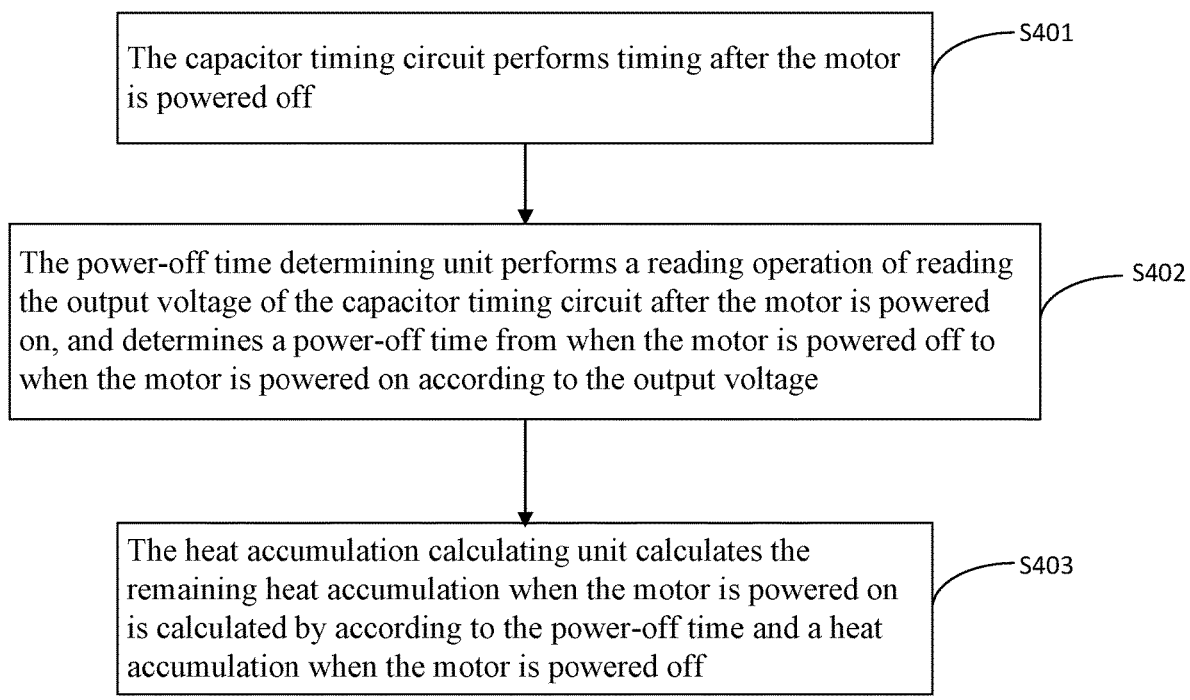
FIG. 4 is a flowchart of an operation method of a motor thermal protection device according to an embodiment of the present disclosure.

FIG. 4 is a flowchart of an operation method of a motor thermal protection device according to an embodiment of the present disclosure. The operation method can be implemented by using a motor thermal protection device 100 (such as the motor thermal protection device 100 shown in FIGS. 1 to 3) including a capacitor timing circuit 101, a power-off time determining unit 102, and a heat accumulation calculating unit 103. The operation method includes steps S401-S403. At step S401, timing is performed by the capacitor timing circuit 101 after the motor is powered off; at step S402, a reading operation of reading the output voltage $V_{thermal}$ of the capacitor timing circuit 101 is performed by the power-off time determining unit 102 after the motor is powered on, and a power-off time $T_{off}$ from when the motor is powered off to when the motor is powered on is determined by the power-off time determining unit 102 according to the output voltage $V_{thermal}$; and at step S403, after the reading operation is completed, the remaining heat accumulation THS(0) when the motor is powered on is calculated by the heat accumulation calculating unit according to the power-off time and a heat accumulation when the motor is powered off.

The above embodiments describe that after the motor is powered off, the capacitor C in the capacitor timing circuit 101 is discharged through the discharge resistor R1 to realize the timing after the power-off. In some scenarios, it is desirable to diagnose whether there is a fault in the motor thermal protection device, especially the capacitor timing circuit 101, during a normal operation of the motor and without the need to power off the motor, and this is beneficial to avoid the situation that the motor or the electromechanical equipment in the circuit is damaged due to the fault in the motor thermal protection device 100 and failure to take protective measures in time.

Figure 5:
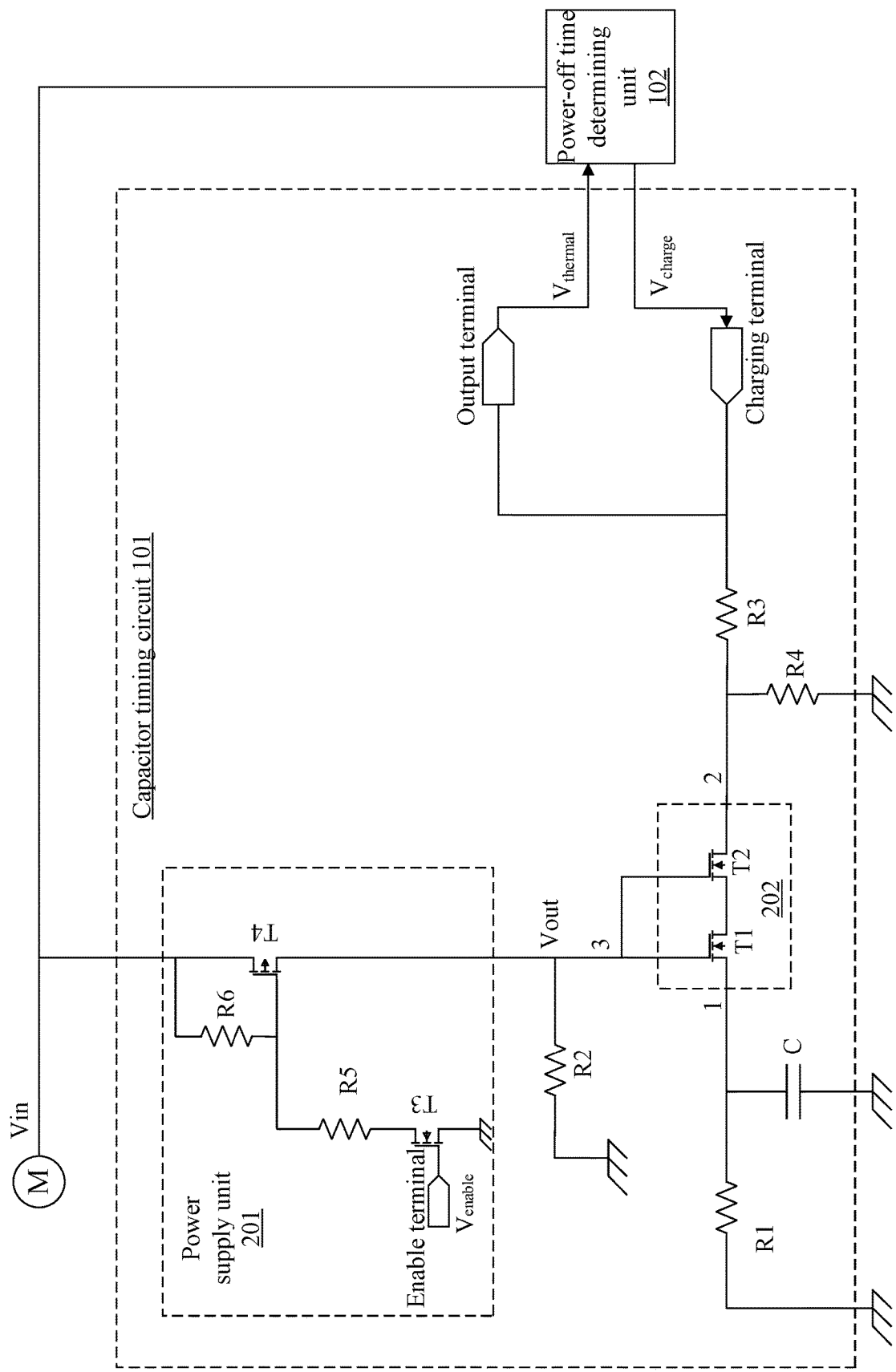
FIG. 5 is a schematic circuit module diagram of a capacitor timing circuit in a motor thermal protection device according to another embodiment of the present disclosure.

In the following, another embodiment of the present disclosure will be described, which can diagnose whether there is a fault in the motor thermal protection device by controlling the charging and discharging of the capacitor C during the power-on of the motor, without the need to power off the motor. FIG. 5 is a schematic circuit diagram of the capacitor timing circuit 101 in the motor thermal protection device 100 according to another embodiment of the present disclosure. It should be noted that the specific structure of the capacitor timing circuit 101 in FIG. 5 can be replaced by other suitable structures.

Referring to FIG. 5, different from the power supply unit 201 in FIGS. 2 and 3, the power supply unit 201 in FIG. 5 further includes an enable terminal, and the voltage of the enable terminal can be provided by a control unit (not shown) of the motor thermal protection device 100. The control unit may be implemented by the MCU, for example, it may share the same MCU with the power-off time determining unit 102 and the heat accumulation calculating unit 103. The enable terminal is configured to control whether the power supply unit 201 may output the voltage $V_{out}$ to be applied to the control terminal 3 of the semiconductor switch module 202. In other words, even if the power supply of the motor supplies power to the motor thermal protection device 100, the capacitor timing circuit 100 may be powered off based on the control of the enable terminal. It should be noted that power supplying for other units, such as the power-off time determining unit 102 and the heat accumulation calculating unit 103, are not affected by the power supply unit 201, as long as the power supply of the motor is not powered off, these units are still powered.

In this embodiment, for example, a circuit of the power supply unit 201 as shown in FIG. 5 may be used. The power supply unit 201 includes an enable terminal, an NMOS transistor T3, a PMOS transistor T4, and resistors R5 and R6. For example, it can be set that when the enable terminal is set to a high-level voltage (for example, 3V), the power supply unit 201 can apply the voltage $V_{out}$ to the control terminal 3 of the semiconductor switch module 202 via the PMOS transistor T4, and the semiconductor switch module 202 is conducted between the first terminal 1 and the second termination 2. In this embodiment, yin is the voltage provided after a necessary conversion of the voltage of the power supply of the motor. $V_{out}$ may be equal to or not equal to $V_{in}$, the present disclosure does not set limits thereto, as long as the magnitude of $V_{out}$ is sufficient to drive the control terminal of the semiconductor switch module 202 without damaging it. On the other hand, it can be set that when the enable terminal is set to a low-level voltage (for example, 0V), the power supply unit 201 is controlled to not output the voltage $V_{out}$ to be applied to the control terminal 3 of the semiconductor switch module 202, and the semiconductor switch module 202 is not conducted between the first terminal 1 and the second termination 2.

As described above, during the power-on of the motor, without the need to power off the motor, the conduction or non-conduction between the first terminal 1 and the second terminal 2 of the semiconductor switch module 202 can also be controlled by the means of the enable terminal.

Figure 6:
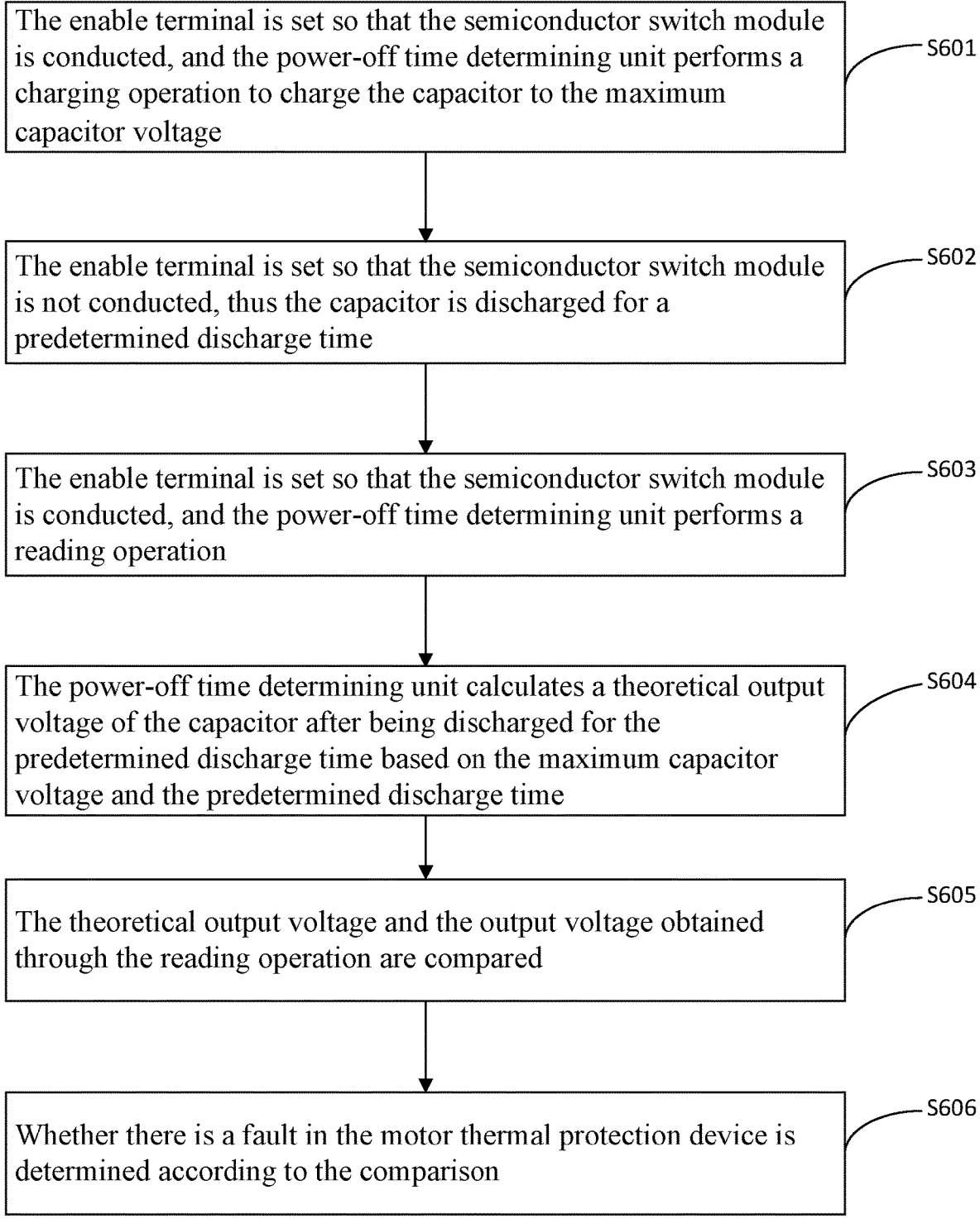
FIG. 6 is a flowchart of a diagnosis operation of a motor thermal protection device according to another embodiment of the present disclosure.

FIG. 6 is a flowchart of a diagnosis operation of the motor thermal protection device 100 according to another embodiment of the present disclosure. The diagnosis operation can be performed by the motor protection device 100 as shown in FIG. 5 during the power-on period of the motor. Referring to FIG. 6, the diagnosis operation includes steps S601-S606. At step S601, the enable terminal is set so that the semiconductor switch module 202 is conducted, and the power-off time determining unit 102 performs the charging operation to charge the capacitor C to the maximum capacitor voltage E. For example, the enable terminal is set to a high-level voltage (for example, 3V) by the control unit of the motor thermal protection device 100, so that the control terminal of the semiconductor switch module 202 is applied with the output voltage $V_{out}$ of the power supply unit 201, it is conducted between the first terminal 1 and the second terminal 2, and the power-off time determining unit 102 can perform a charging operation to charge the capacitor C to the maximum capacitor voltage E; at step S602, the enable terminal is set so that the semiconductor switch module 202 is not conducted, thus the capacitor C is discharged for a predetermined discharge time $t_{pre}$. For example, the control unit of the motor thermal protection device 100 sets the enable terminal to a low-level voltage (for example, 0V), so that the first terminal 1 and the second terminal 2 of the semiconductor switch module 202 are not conducted, and the capacitor C is discharged through the first resistor R1, and the predetermined discharge time $t_{pre}$ can be set to a range of 1 second to 2 seconds, so as to avoid failing to complete the diagnosis operation due to a power failure of the motor before the discharging reaches the predetermined discharge time $t_{pre}$; at step S603, the enable terminal is set so that the semiconductor switch module 202 is conducted, and the power-off time determining unit 102 performs the reading operation. For example, similar to the foregoing, the enable terminal is set to a high-level voltage (for example, 3V) by the control unit of the motor thermal protection device 100, so that the semiconductor module 202 is conducted between the first terminal 1 and the second terminal 2, and the power-off time determining unit 102 may read the output voltage $V_{thermal}$ of the capacitor timing circuit 101 after the predetermined discharge time $t_{pre}$ has elapsed; at step S604, the power-off time determining unit 102 may, according to equation (1), calculate a theoretical output voltage (that is, a theoretical value of the output voltage) $V_{theory}$ of the capacitor C after the predetermined discharge time $t_{pre}$ based on the maximum capacitor voltage E and the predetermined discharge time $t_{pre}$; at step S605, the power-off time determining unit 102 compares the theoretical output voltage $V_{theory}$ and the output voltage $V_{thermal}$ obtained through the reading operation. There are many ways to compare, for example, a difference between the theoretical output voltage $V_{theory}$ and the output voltage $V_{thermal}$ can be compared or a percentage ratio of the difference to the theoretical output voltage $V_{theory}$ can be compared. At step S606, it is determined whether there is a fault in the motor thermal protection device according to the comparison at step S605. For example, it can be judged whether there is a fault in the motor thermal protection device 100 according to a preset fault diagnosis criterion.

There are multiple preset fault diagnosis criteria, for example, when the difference between the output voltage $V_{thermal}$ and the theoretical output voltage $V_{theory}$ exceeds a certain proportional range (for example, ±5%) of the theoretical output voltage, it is determined that there is a fault in the motor thermal protection module 100, the present disclosure does not set limits thereto, and any other suitable diagnosis criteria may also be used.

In addition to diagnosing whether there is a fault in the motor thermal protection device during the power-on period of the motor, this embodiment can also implement the calibration operation of the capacitor C in the capacitor timing circuit 101. For example, when the motor thermal protection device 100 leaves the factory, the manufacturer can calibrate a capacitance value of the capacitor C in the capacitor timing circuit 101 to obtain a calibrated capacitance value that can be used as the basis for various related calculations as described above during use after leaving the factory, for example, the calibrated capacitance value is used in the calculation process of the power-off time from when the motor is powered off to when the motor is powered on as described above. Still referring to FIG. 5, during a period when the motor thermal protection device is connected to the motor and the motor is powered on, or during a period when the motor thermal protection device is not connected to the motor and the motor thermal protection device is powered by an external power supply, the semiconductor switch module 202 is controlled by the enable terminal to be conducted between the first terminal 1 and the second terminal 2, and while keeping the conduction between the first terminal 1 and the second terminal 2 of the semiconductor switch module 202, the capacitor C is charged by setting the charging terminal to the charging voltage input state, and the capacitor C is discharged through the first resistor R1 and the fourth resistor R4 by setting the charging terminal to the high-resistance input state. Optionally, the resistance value of the fourth resistor R4 can be set to be much smaller than the resistance value of the first resistor R1, so that the capacitor C is mainly discharged from the fourth resistor R4, thereby having a more obvious and easy-to-observe discharge amount in a shorter discharge time. In this case, since the resistance value of R1 is much larger than the resistance value of the fourth resistor R4, the discharge amount through R1 can be ignored. In this way, when the thermal protection device is connected to the motor and the motor is powered on, or when the thermal protection device is not connected to the motor and is powered by an external power supply, the capacitor C in the capacitor timing circuit 101 can be controlled to charge or discharge by means of the enable terminal and setting the state of control charging terminal, and then the capacitance value of capacitor C can be calibrated.

Figure 7:
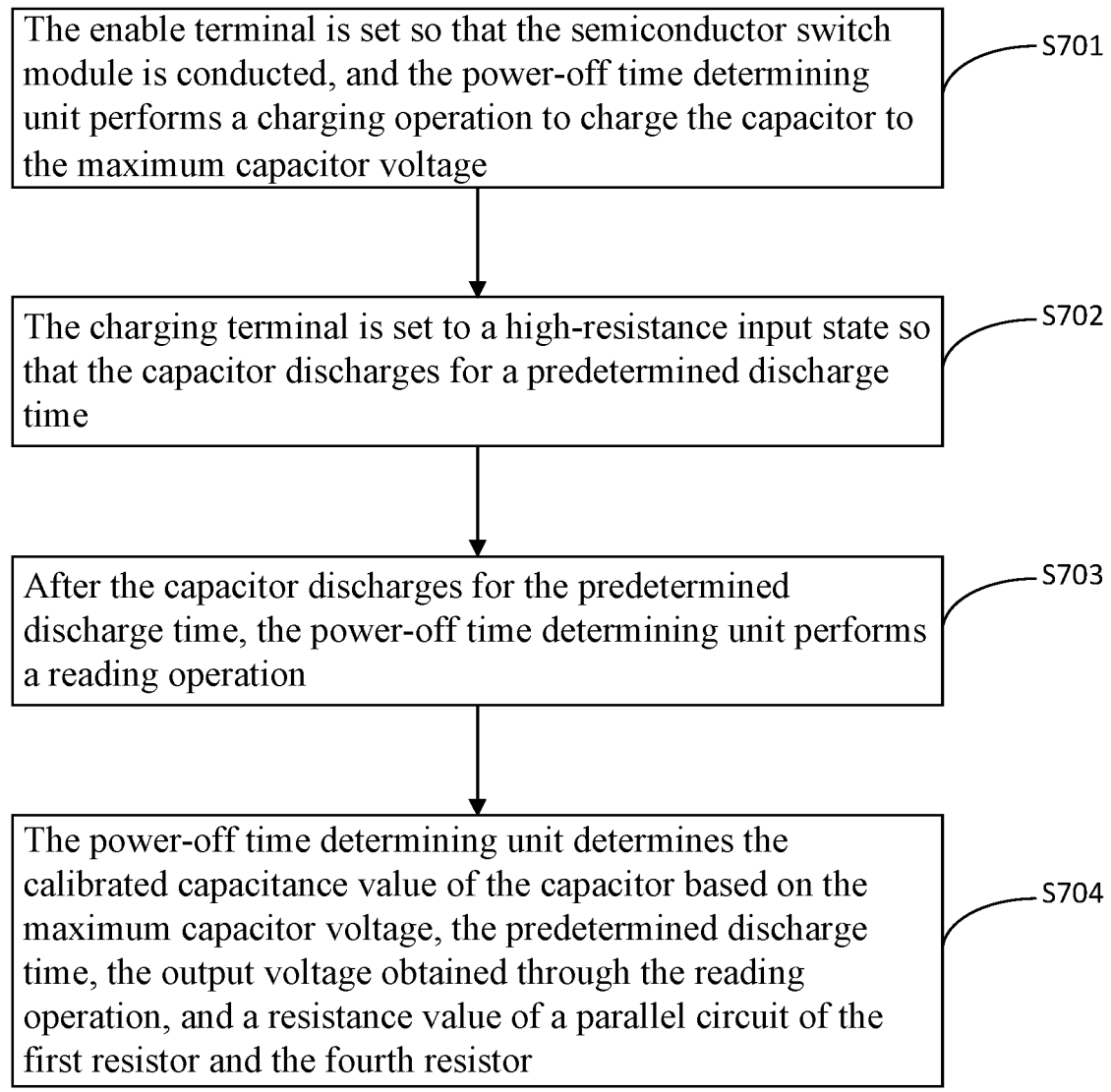
FIG. 7 is a flowchart of a calibration operation of a motor thermal protection device according to another embodiment of the present disclosure.

FIG. 7 is a flow chart of a calibration operation of the motor thermal protection device 100 according to another embodiment of the present disclosure. The calibration operation may be performed by the motor thermal protection device 100 as shown in FIG. 5 during a period when it is connected to the motor and the motor is powered on, or during a period when it is not connected to the motor and is powered by an external power supply. At step S701, similar to step S601, the enable terminal is set so that the semiconductor switch module 202 is conducted, and the power-off time determining unit 102 performs a charging operation to charge the capacitor C to the maximum capacitor voltage E; at step S702, the charging terminal is set to the high-resistance input state so that the capacitor C can be discharged for a predetermined discharge time $t_{pre}$, which can be set to, for example, 1 second, 2 seconds, etc. as needed, but can not exceed the time required for the capacitor C to be discharged to zero, optionally, the predetermined discharge time $t_{pre}$ can be set as a theoretical discharge time for the capacitor C to discharge to half of the maximum capacitor voltage E, so as to improve the calibration accuracy; at step S703, after the capacitor C is discharged for the predetermined discharge time $t_{pre}$, the power-off time determining unit 102 performs the reading operation to read the output voltage $V_{thermal}$ of the capacitor timing circuit 101 after the predetermined discharge time $t_{pre}$; at step S704, the power-off time determining unit 102 may determine the calibrated capacitance value of the capacitor C based on a voltage across the capacitor C when the semiconductor switch module is not conducted(e.g., the maximum capacitor voltage E), the predetermined discharge time $t_{pre}$, the output voltage $V_{thermal}$ and a resistance value of a parallel circuit of the first resistor R1 and the fourth resistor R4, according to the following equation (5) as a variation of equation (1):

$$C = \frac{t_{pre}}{-1 * R * \ln\left(1 - \frac{V_{thermal}}{E}\right)} \quad (5)$$

where R is the resistance value of the parallel circuit of R1 and R4, when R4 is far less than R1 in resistance value, R is approximately equal to R4.

When the motor thermal protection device leaves the factory, the calibrated capacitance value of capacitor C can be obtained by performing steps S701 to S704, and the calibrated capacitance value can be used as the basis for calculating the power-off time of the capacitor, which will be beneficial for more accurate monitoring of the accumulative heat accumulation of the motor in real-time.

It should be noted that the embodiments of the present disclosure have no specific limits on the resistance values of resistors R1-R6, the capacitance value of capacitor C, the voltage values of voltages $V_{in}$, $V_{out}$ and $V_{charge}$, and the types of MOS transistor T1-T4, as long as the functions described in the embodiments of the present disclosure can be realized, any appropriate value can be used without departing from the protection scope of the present disclosure.

In addition, in order to reduce leakage current, the capacitor C included in the capacitor timing circuit of the present disclosure can use tantalum capacitors, electrolytic capacitors and other capacitors with small leakage current.

In the motor thermal protection device and operation method thereof according to embodiments of the present disclosure, the power-off time from when the motor is powered off to when the motor is powered on is obtained according to the principle of capacitor charging and discharging, the remaining heat accumulation when the motor is powered on is obtained by using the motor thermal model, so that the accumulative heat accumulation of the motor over time can be tracked and monitored in real time, and the motor can be powered off when the accumulative heat accumulation satisfies the preset criterion, so as to protect the motor and the electromechanical equipment in the circuit from being damaged due to overheating of the motor. At the same time, according to embodiments of the present disclosure, the diagnosis operation can also be performed on the motor thermal protection device during the power-on period of the motor to determine whether there is a fault in the motor thermal protection device, and the calibration operation can also be performed on the capacitor in the motor thermal protection device to calibrate the capacitance value of capacitor included therein at the time of leaving the factory.

The whole or components of the hardware computing device described in the present disclosure may be implemented by various suitable hardware means, including but not limited to FPGA, ASIC, SOC, discrete gate or transistor logic, discrete hardware components, or any combination thereof.

The block diagrams of circuits, means, apparatus, devices, and systems involved in the present disclosure are merely illustrative examples and are not intended to require or imply that they must be connected, arranged, and configured in the manner shown in the block diagrams. As those skilled in the art will recognize, these circuits, means, apparatus, devices, and systems may be connected, arranged, and configured in any manner, as long as the desired purpose may be achieved.

Those skilled in the art should understand that the specific embodiments described above are only examples and not limitations. Various modifications, combinations, partial combinations and replacements may be made to the embodiments of the present disclosure according to design requirements and other factors, as long as they fall within the scope of the appended claims or their equivalents, that is, they belong to the scope of claims to be protected by the present disclosure.

What is claimed is:

1. A motor thermal protection device which utilizes a power supply of a motor for power supplying, the motor thermal protection device comprises:
   a capacitor timing circuit, configured to time after the motor is powered off;
   a power-off time determining unit, configured to perform a reading operation of reading an output voltage of the capacitor timing circuit after the motor is powered on, and determine a power-off time from when the motor is powered off to when the motor is powered on according to the output voltage; and
   a heat accumulation calculating unit, configured to calculate a remaining heat accumulation when the motor is powered on according to the power-off time determined by the power-off time determining unit and a heat accumulation when the motor is powered off, wherein:
   the capacitor timing circuit comprises a power supply unit, a capacitor, a first resistor, a semiconductor switch module, a charging terminal, and an output terminal;
   the power supply unit is powered by a power supply of the motor and outputs a voltage to be applied to a control terminal of the semiconductor switch module, after the motor is powered off, the power supply unit stops outputting the output voltage to be applied to the control terminal of the semiconductor switch module;
   the semiconductor switch module comprises a first terminal, a second terminal and the control terminal, the control terminal of the semiconductor switch module controls the first terminal and the second terminal of the semiconductor switch module to be conducted when receiving the voltage output by the power supply unit, the first terminal of the semiconductor switch module is connected to a first terminal of the capacitor, and the second terminal of the semiconductor switch module is connected to the charging terminal and the output terminal;
   a second terminal of the capacitor is grounded;
   a first terminal of the first resistor is connected to the first terminal of the capacitor, and a second terminal of the first resistor is grounded; and
   the power-off time determining unit is connected to the charging terminal and the output terminal, the power-off time determining unit performs the reading operation through the output terminal after the motor is powered on, and performs a charging operation of providing a capacitor charging voltage to the capacitor timing circuit through the charging terminal after the reading operation is completed.

2. The motor thermal protection device of claim 1, wherein
   the reading operation of the power-off time determining unit comprises reading the output voltage of the capacitor timing circuit from the output terminal when the charging terminal is set to a high-resistance input state, and
   the charging operation of the power-off time determining unit comprises providing the capacitor charging voltage to the charging terminal when the charging terminal is set to a charging voltage input state.

3. The motor thermal protection device of claim 2, wherein
   the power supply unit comprises an enable terminal which is configured to control whether the power supply unit can output the voltage to be applied to the control terminal of the semiconductor switch module.

4. The motor thermal protection device of claim 3, wherein
   the capacitor timing circuit further comprises a second resistor;
   a first terminal of the second resistor is connected to the control terminal of the semiconductor switch module, and a second terminal of the second resistor is grounded.

5. The motor thermal protection device of claim 3, wherein
   the capacitor timing circuit further comprises a fourth resistor;
   a first terminal of the fourth resistor is connected to the second terminal of the semiconductor switch module, and a second terminal of the fourth resistor is grounded.

6. The motor thermal protection device of claim 5, wherein
   during power-on period of the motor, the motor thermal protection device is further configured to perform the following operations:
   the enable terminal is set so that the semiconductor switch module is conducted, and the power-off time determining unit performs the charging operation to charge the capacitor to the maximum capacitor voltage;
   the charging terminal is set to the high-resistance input state so that the capacitor is discharged for a predetermined discharge time;
   after the capacitor is discharged for the predetermined discharge time, the power-off time determining unit performs the reading operation;
   the power-off time determining unit determines a capacitance value of the calibrated capacitor based on the maximum capacitor voltage, the predetermined discharge time, the output voltage obtained through the reading operation, and a resistance value of a parallel circuit of the first resistor and the fourth resistor.

7. The motor thermal protection device of claim 3, wherein the capacitor timing circuit further comprises a third resistor;
a first terminal of the third resistor is connected to the second terminal of the semiconductor switch module, and a second terminal of the third resistor is connected to the charging terminal.

8. The motor thermal protection device of claim 3, wherein during power-on period of the motor, the motor thermal protection device is further configured to perform the following operations:
the enable terminal is set so that the semiconductor switch module is conducted, and the power-off time determining unit performs the charging operation to charge the capacitor to the maximum capacitor voltage;
the enable terminal is set so that the semiconductor switch module is not conducted, and so that the capacitor is discharged for a predetermined discharge time;
the enable terminal is set so that the semiconductor switch module is conducted, and the power-off time determining unit performs the reading operation;
the power-off time determining unit determines a theoretical output voltage of the capacitor after being discharged for the predetermined discharge time based on the maximum capacitor voltage and the predetermined discharge time;
the power-off time determining unit compares the theoretical output voltage and the output voltage obtained through the reading operation;
determining whether there is a fault in the motor thermal protection device according to the comparison.

9. The motor thermal protection device of claim 1, wherein
the semiconductor switch module comprises at least one MOS transistor connected in series,
each MOS transistor of the at least one MOS transistor comprises a control terminal, a first terminal, and a second terminal;
when receiving the voltage output by the power supply unit, the control terminal of each MOS transistor of the at least one MOS transistor controls a conduction between the first terminal and the second terminal thereof;
respective control terminal of respective MOS transistor of the at least one MOS transistor are connected together as the control terminal of the semiconductor switch module;
a first terminal of a first MOS transistor of the at least one MOS transistor connected in series is connected as the first terminal of the semiconductor switch module to the first terminal of the capacitor, and a second terminal of a last MOS transistor of the at least one MOS transistor connected in series is connected as the second terminal of the semiconductor switch module to the charging terminal and the output terminal.

10. The motor thermal protection device of claim 1, wherein
the heat accumulation calculating unit further calculates an accumulative heat accumulation of the motor based on the remaining heat accumulation at predetermined time intervals, and causes the motor to power off when the accumulative heat accumulation exceeds a threshold value of the accumulative heat accumulation.

11. An operation method of a motor thermal protection device which utilizes a power supply of a motor for power supplying and comprises a capacitor timing unit, a power-off time determining unit and a heat accumulation calculating unit, and the method comprises:

timing, by the capacitor timing unit, after the motor is powered off;
performing, by the power-off time determining unit, a reading operation of reading an output voltage of the capacitor timing circuit after the motor is powered on, and determining, by the power-off time determining unit, a power-off time from when the motor is powered off to when the motor is powered on according to the output voltage; and
calculating, by the heat accumulation calculating unit, a remaining heat accumulation when the motor is powered on according to the power-off time determined by the power-off time determining unit and a heat accumulation when the motor is powered off, wherein:
the capacitor timing circuit comprises a power supply unit, a capacitor, a first resistor, a semiconductor switch module, a charging terminal, and an output terminal, and the power-off time determining unit is connected to the charging terminal and the output terminal of the capacitor timing circuit;
the power supply unit is powered by a power supply of the motor and outputs a voltage to be applied to a control terminal of the semiconductor switch module, after the motor is powered off, the power supply unit stops outputting the output voltage to be applied to the control terminal of the semiconductor switch module;
the semiconductor switch module comprises a first terminal, a second terminal and the control terminal, the control terminal of the semiconductor switch module controls the first terminal and the second terminal of the semiconductor switch module to be conducted when receiving the voltage output by the power supply unit, the first terminal of the semiconductor switch module is connected to a first terminal of the capacitor, and the second terminal of the semiconductor switch module is connected to the charging terminal and the output terminal;
a second terminal of the capacitor is grounded;
a first terminal of the first resistor is connected to the first terminal of the capacitor, and a second terminal of the first resistor is grounded; and
the power-off time determining unit performs the reading operation through the output terminal;
the method further comprises: performing, by the power-off time determining unit, a charging operation of providing a capacitor charging voltage to the capacitor timing circuit through the charging terminal after the reading operation is completed;
wherein the reading operation comprises reading the output voltage of the capacitor timing circuit from the output terminal when the charging terminal is set to a high-resistance input state, and
the charging operation comprises providing the capacitor charging voltage to the charging terminal when the charging terminal is set to a charging voltage input state.

12. The operation method of claim 11, wherein the power supply unit comprises an enable terminal which is configured to control whether the power supply unit can output the voltage to be applied to the control terminal of the semiconductor switch module, and the method further comprises:
during power-on period of the motor,
setting the enable terminal so that the semiconductor switch module is conducted, and the power-off time determining unit performs the charging operation to charge the capacitor to a maximum capacitor voltage;

setting the enable terminal so that the semiconductor switch module is not conducted, and so that the capacitor is discharged for a predetermined discharge time;

setting the enable terminal so that the semiconductor switch module is conducted, and the power-off time determining unit performs the reading operation;

determining, by the power-off time determining unit, a theoretical output voltage of the capacitor after being discharged for the predetermined discharge time based on the maximum capacitor voltage and the predetermined discharge time;

comparing the theoretical output voltage and the output voltage obtained through the reading operation;

determining whether there is a fault in the motor thermal protection device according to the comparison.

13. The operation method of claim 11, wherein the power supply unit comprises an enable terminal which is configured to control whether the power supply unit can output the voltage to be applied to the control terminal of the semiconductor switch module, and the capacitor timing circuit further comprises a fourth resistor; a first terminal of the fourth resistor is connected to the second terminal of the semiconductor switch module, and a second terminal of the fourth resistor is grounded, the method further comprises:

during power-on period of the motor, setting enable terminal so that the semiconductor switch module is conducted, and the power-off time determining unit performs the charging operation to charge the capacitor to a maximum capacitor voltage;

setting the charging terminal to a high-resistance input state so that the capacitor is discharged for a predetermined discharge time;

after the capacitor is discharged for the predetermined discharge time, performing, by the power-off time determining unit, the reading operation;

determining, by the power-off time determining unit, a calibrated capacitance value of the capacitor based on the maximum capacitor voltage, the predetermined discharge time, the output voltage obtained through the reading operation, and a resistance value of a parallel circuit the first resistor and the fourth resistor.

14. The operation method of claim 11, further comprising:
calculating, by the heat accumulation calculating unit, an accumulative heat accumulation of the motor based on the remaining heat accumulation at predetermined time intervals, and causing, by the heat accumulation calculating unit, the motor to power off when the accumulative heat accumulation exceeds a threshold value of the accumulative heat accumulation.

* * * * *